(12) United States Patent
Miyazaki et al.

(10) Patent No.: US 7,566,414 B2
(45) Date of Patent: Jul. 28, 2009

(54) METHOD FOR MANUFACTURING POWER-METALLURGY PROCESSED NB₃SN SUPERCONDUCTING WIRE, PRECURSOR TO POWDER-METALLURGY PROCESSED NB₃SN SUPERCONDUCTING WIRE

(75) Inventors: Takayoshi Miyazaki, Kobe (JP); Takayuki Miyatake, Kobe (JP); Hiroyuki Kato, Kobe (JP); Kyoji Zaitsu, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 557 days.

(21) Appl. No.: 11/367,459

(22) Filed: Mar. 6, 2006

(65) Prior Publication Data
US 2006/0216191 A1 Sep. 28, 2006

(30) Foreign Application Priority Data
Mar. 24, 2005 (JP) .............................. 2005-086575

(51) Int. Cl.
*B22F 5/12* (2006.01)
*H01L 39/24* (2006.01)

(52) U.S. Cl. ............................... 419/8; 419/23; 419/46; 148/98; 505/432

(58) Field of Classification Search ...................... 419/8, 419/23, 46; 148/98; 505/432
See application file for complete search history.

(56) References Cited

U.S. PATENT DOCUMENTS 4,043,028 A 8/1977 Koike et al.
4,762,553 A * 8/1988 Savage et al. ................. 75/336
4,909,983 A * 3/1990 Dahms ........................ 419/38

FOREIGN PATENT DOCUMENTS

| DE | 23 60 129 A1 | 12/1973 |
| EP | 0 169 596 B1 | 6/1985 |
| JP | 49-114389 | 2/1973 |
| JP | 52-16997 | 7/1975 |
| JP | 4-141916 | 10/1990 |
| JP | 05-028860 | 7/1991 |
| JP | 05-290655 | 4/1992 |
| JP | 05-342932 | 6/1992 |

OTHER PUBLICATIONS

Terence Wong et al., "Ti and Ta Additions to Nb₃Sn by the Powder in Tube Process", IEEE Transactions on Applied Superconductivity, vol. 11, No. 1, Mar. 2001, XP-001164368, pp. 3584-3587.

* cited by examiner

*Primary Examiner*—Roy King
*Assistant Examiner*—Ngoclan T Mai
(74) *Attorney, Agent, or Firm*—Reed Smith LLP; Juan Carlos A. Marquez, Esq.

(57) ABSTRACT

A method for manufacturing a powder-metallurgy processed Nb₃Sn superconducting wire is provided. In the method, a sheath made of Nb or a Nb alloy is filled with a raw material powder containing Sn. The sheath filled with the raw material powder is subjected to diameter reduction to form a wire. The wire is heat-treated to form a superconducting phase at the internal surface of the sheath. The raw material powder is prepared by adding a Sn powder to a Cu—Sn alloy powder or a Cu—Sn intermetallic compound powder, and is compacted under isotropic pressure.

13 Claims, 1 Drawing Sheet

METHOD FOR MANUFACTURING POWER-METALLURGY PROCESSED NB₃SN SUPERCONDUCTING WIRE, PRECURSOR TO POWDER-METALLURGY PROCESSED NB₃SN SUPERCONDUCTING WIRE

BACKGROUND OF THE INVENTION

1. Field of the Invention

The present invention relates to methods for manufacturing $Nb_3Sn$ superconducting wires by the powder metallurgy process. In particular, the invention relates to a method for manufacturing a powder-metallurgy processed $Nb_3Sn$ superconducting wire useful as the material of superconducting magnets used for high magnetic field generation, and to a precursor to the powder-metallurgy processed $Nb_3Sn$ superconducting wire.

2. Description of the Related Art

Among the fields using superconducting wires in practice are superconducting magnets used in high-resolution nuclear magnetic resonance (NMR) spectrometers. The higher magnetic field a superconducting magnet generates, the higher resolution is achieved. Accordingly, superconducting magnets capable of generating higher magnetic field are desired more and more.

For example, $Nb_3Sn$ wire is in practical use as the superconducting wire used for the superconducting magnet for high magnetic field generation. The $Nb_3Sn$ superconducting wire is generally manufactured by the bronze process. In the bronze process, Nb-based cores are buried in a Cu—Sn-based alloy (bronze) matrix and drawn into filaments. The filaments are bundled together to use as the material of the superconducting wire. The bundle of the filaments is buried in copper for stabilization (stabilizing copper), and drawn into a wire.

The resulting wire is subjected to heat-treatment (diffusion heat treatment) at 600 to 800° C., thereby forming a $Nb_3Sn$ phase at the interfaces between the Nb-based filaments and the matrix. Unfortunately, this process limits the content of Sn turning into a solid solution in bronze (to 15.8 mass % or less), and accordingly the resulting $Nb_3Sn$ phase has a small thickness. Also, the crystallinity of the $Nb_3Sn$ is degraded and the properties in high magnetic fields are inferior.

In addition to the bronze process, a tube process and an internal diffusion process are also known as methods for manufacturing $Nb_3Sn$ superconducting wire. The tube process has disclosed in, for example, Japanese Unexamined Patent Application Publication No. 52-16997. In this process, a Nb tube containing a Sn core is inserted in a Cu pipe and subjected to diameter reduction, followed by heat treatment. Thus, the Nb and the Sn diffuse and react with each other to produce $Nb_3Sn$. The internal diffusion process has been disclosed in, for example, Japanese Unexamined Patent Application Publication No. 49-114389. In this process, a Sn core is buried in the center of a Cu base material. A plurality of Nb wires are placed in the Cu base material around the Sn core. After diameter reduction, the Sn is diffused by heat treatment to react with the Nb, thereby producing $Nb_3Sn$. These processes have no limit of the Sn content, unlike the bronze process, which limits the Sn content due to the solid solubility limit. Accordingly, the Sn content can be set as high as possible to enhance the superconducting properties of the resulting wire.

The $Nb_3Sn$ superconducting wire may be manufactured by another process, a powder metallurgy process. For example, in Japanese Unexamined Patent Application Publication No. 5-290655, a Nb or Nb alloy sheath is filled with a mixture of Cu powder and Sn powder as a core (powder core). After diameter reduction by, for example, extrusion or wiredrawing, the material is subjected to heat treatment (diffusion heat treatment). In this process, the surfaces of the Sn powder particles may be coated with Cu plating in order to ensure the flowability of the powder mixture. In order to enhance the characteristics of the superconducting wire, for example, Japanese Unexamined Patent Application Publication No. 5-28860 has disclosed a technique in which Ti, Zr, Hf, Al, Ta, or the like is added to the powder mixture of Cu and Sn. These processes can produce a thicker and more high-quality $Nb_3Sn$ phase than the bronze process, and are accordingly expected to produce superconducting wires with superior high magnetic field properties and allow a high Sn content in the powder mixture.

FIG. 1 is a schematic sectional view of a state in the course of manufacture of a powder-metallurgy processed $Nb_3Sn$ superconducting wire, wherein reference numeral 1 represents the Nb or Nb alloy sheath; reference numeral 2 represents a powder core formed of a raw material powder packed in the sheath 1; and reference numeral 3 represents a stabilizing copper (Cu matrix). In the powder metallurgy process, the sheath 1 is filled with a raw material powder containing at least Sn to form the powder core 2, and the sheath 1 is placed in the stabilizing copper 3, followed by diameter reduction performed by, for example, extrusion or wiredrawing. The resulting wire is wound around a magnet or the like and subsequently heat-treated, so that a $Nb_3Sn$ superconducting phase is formed at the internal surface of the sheath 1.

The raw material powder must contain Sn. However, if Sn is contained in a form of powder, the Sn powder has a low melting point and, accordingly, may melt out by heat of extrusion or wiredrawing. Also, the raw material powder containing Sn powder is disadvantageously difficult to anneal during extrusion or wiredrawing. Furthermore, the Cu powder and the Sn powder have different specific gravities and grain sizes. It is therefore difficult to uniformly mix these powders. Consequently, Cu—Sn alloys or compounds are nonuniformly produced in the material during heat treatment and cause the material to break.

In view of these disadvantages, another technique has been proposed in which Sn is alloyed in advance. For example, Japanese Unexamined Patent Application Publication No. 5-342932 has proposed a process in which breakage or other problems resulting from the segregation of the Cu—Sn alloy or compound can be prevented by filling a Nb or Nb-based alloy sheath with a previously prepared compound (or alloy) powder of Cu and Sn to form the core (powder core).

While it is considered that the heat treatment for forming the superconducting phase is preferably performed at a high temperature of about 900 to 1000° C., it is known that the presence of Cu in the raw material powder can reduce the heat treatment temperature to about 650 to 750° C. The Cu contained in the raw material powder is intended for this effect. Incidentally, although the core schematically shown in FIG. 1 is single, a plurality of cores are generally placed in the Cu matrix in practice.

For use of a Cu—Sn alloy or intermetallic compound powder as the raw material powder, a Cu powder and a Sn powder are weighed out and mixed, and the mixture is heat-treated and then pulverized. However, the powder thus prepared (hereinafter may be referred to as Cu—Sn compound powder) is so hard and brittle as to make it difficult to fill the sheath uniformly, and the percentage of the packed powder becomes low.

In general, the raw material powder is packed into the sheath by uniaxial press. On the other hand, it is considered that the percentage of the packed powder can be increased by isotropic compaction, such as cold isostatic press (CIP), and that the isotropic compaction is effective in producing a uniform wire. However, even if the CIP is applied to the Cu—Sn compound powder, the resulting compact is brittle and easy to crack or break. It is thus difficult to fill the sheath. From the viewpoint of increasing the strength of the compact, hot isostatic press (HIP) may be useful. This technique, however, causes the Cu—Sn compound powder particles to be bound to each other. Consequently, the cutting workability of the resulting compact is enhanced, but its plastic workability is degraded. Thus, the extrusion and wiredrawing of the compact becomes difficult.

SUMMARY OF THE INVENTION

Accordingly, an object of the present invention is to provide a method for uniformly manufacturing a powder-metallurgy processed $Nb_3Sn$ superconducting wire without breakage, and through which the resulting superconducting wire exhibits superior superconducting properties even if heat treatment is performed at relatively low temperature.

The invention is directed to a method for manufacturing a powder-metallurgy processed $Nb_3Sn$ superconducting wire. In the method, a sheath made of Nb or a Nb alloy is filled with a raw material powder containing Sn. The diameter of the sheath filled with the raw material powder is reduced to form a wire. The wire is heat-treated to form a superconducting phase at the internal surface of the sheath. The raw material powder is prepared by adding a Sn powder to a Cu—Sn alloy powder or a Cu—Sn intermetallic compound powder and compacting the mixture under isotropic pressure before the step of filling the sheath.

The invention is also directed to a precursor to a powder-metallurgy processed $Nb_3Sn$ superconducting wire used the manufacture of powder-metallurgy processed $Nb_3Sn$ superconducting wires. The precursor includes a sheath made of Nb or a Nb alloy and a raw material powder filling the sheath. The raw material powder contains a Cu—Sn alloy powder or a Cu—Sn intermetallic compound powder and a Sn powder, and has been compacted under isotropic pressure. In the manufacture, the precursor is subjected to diameter reduction to form a wire, and then heat-treated to form a superconducting phase at the interface between the sheath and the raw material powder.

Preferably, the Cu—Sn alloy powder or the Cu—Sn intermetallic compound powder has a maximum grain size of about 15 μm or less. Preferably, the Sn content in the Cu—Sn alloy powder or the Cu—Sn intermetallic compound powder is in the range of about 20 to 80 mass %, and the Sn powder is contained in the raw material powder at mass ratio of about 0.2 to 2 relative to the Cu—Sn alloy powder or the Cu—Sn intermetallic compound powder.

Preferably, the Sn powder in the raw material powder contains 2,000 ppm or less of oxygen. Such a Sn powder may be prepared by inert gas atomization.

Preferably, the sheath is surrounded by an intermediate barrier layer containing at least one metal element selected from the group consisting of Ta, Nb, V, Zr, Mo, and Ti. Preferably, the raw material powder filling the sheath has a two-layer structure including an inner layer and an outer layer and the outer layer is formed of part of the Sn powder.

In the present invention, the raw material powder is prepared by adding the Sn powder to the Cu—Sn compound powder that has been prepared in advance by a reaction between Cu and Sn. This method allows the increase of Sn forming a $Nb_3Sn$ phase, and thus can achieve a sufficient amount of uniform superconductor even if the heat treatment temperature for forming the $Nb_3Sn$ phase is performed at a relatively low temperature of 750° C. or less. The resulting $Nb_3Sn$ superconducting wire exhibits a high critical current density. Since the Sn powder is added to the previously prepared Cu—Sn compound powder, very hard Cu—Sn compounds are not produced by the reaction (melt diffusion) producing the Cu—Sn compound. Consequently, the occurrence of abnormal deformation or breakage can be minimized. The ductility can be increased by CIP to enhance the mechanical workability. This means that the fabrication of extrusion billets becomes easy. Furthermore, the workability in wiredrawing can be enhanced, so that uniform wires can be achieved.

DESCRIPTION OF THE PREFERRED EMBODIMENTS

Figure 1:
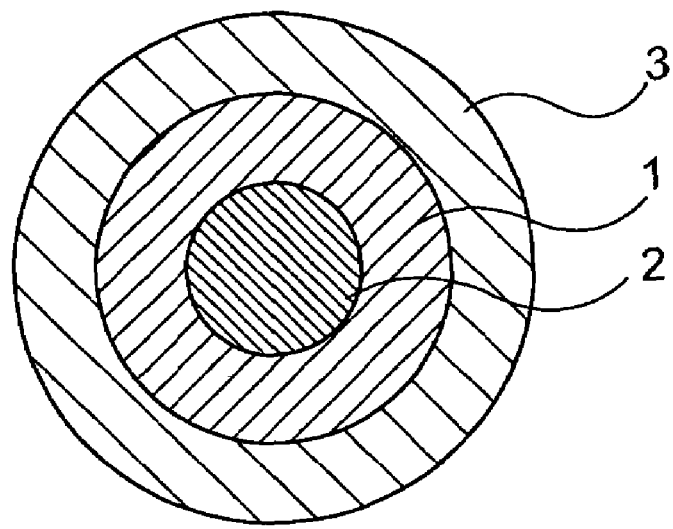
FIG. 1 a schematic sectional view of a state in course of a process for producing a powder-metallurgy processed $Nb_3Sn$ superconducting wire.

The present inventors have found that by using a precursor formed of a raw material powder containing a Sn powder and a Cu—Sn compound powder that has been prepared in advance by allowing Cu and Sn to react with each other (by melt diffusion) and pulverizing the reaction product, in a powder metallurgy process for producing a $Nb_3Sn$ superconducting wire, the object of the present invention can be achieved.

More specifically, it has been found that in the preparation of the Cu—Sn compound powder used as the raw material powder in the powder metallurgy process, only a minimum amount of Sn sufficient to react with a predetermined amount of Cu, but not the entirety of the Sn in the raw material, can be used for the melt diffusion. The use of the precursor thus prepared allows the increase of the amount of Sn powder added after the melt diffusion. Consequently, the resulting $Nb_3Sn$ superconducting wire exhibits a high critical current density, even if heat treatment is performed at a temperature of 750° C. or less. Thus, the superconducting properties of the $Nb_3Sn$ superconducting wire can be enhanced.

In the process according to the embodiment, since the Sn powder is added after the preparation of the Cu—Sn compound powder, hard Cu—Sn compounds are not produced in the reaction (melt diffusion) producing the Cu—Sn compound, and the resulting Cu—Sn compound is present in a highly dispersed state in the Sn powder. The Sn thus serves as a medium to minimize the occurrence of abnormal problems in the process of wire production, such as breakage of the sheath by the Cu—Sn compound, and the breakage of the wire.

The raw material powder used in the present embodiment is a mixture of a Cu—Sn compound powder and a Sn powder. In the raw material powder, the Sn powder, which has good workability, is dispersed in the brittle Cu—Sn compound powder. Consequently, a good plastic workability of the powder core is maintained even after compaction by, for example, CIP. If a mixture of a Cu powder and a Sn powder is used, the Sn powder is liable to melt out by heat for extrusion. The mixture containing alloyed Sn can prevent this disadvantage.

After CIP, heat treatment at about 200 to 300° C. is effective in suitably binding the particles of the Sn powder, consequently increasing the percentage of the raw material powder packed in the sheath. Alternatively, CIP may be replaced with isotropic compaction at 200 to 300° C. (warm isostatic press, hereinafter referred to as WIP). Also, a Cu powder may be added together with the Sn powder.

In the CIP or the WIP, the raw material powder is placed in a rubber mold and then compacted. The resulting compact can be cut to increase the precision of billet fabrication. The compaction is preferably performed under a pressure of 150 MPa or more from the viewpoint of achieving a higher density. The pressure may be gradually increased.

In order to achieve superior superconducting properties, the raw material powder may further contain Ti. A small amount of Ti turns into a solid solution in a reacting phase in the stage of forming the superconducting phase, thereby enhancing the superconducting properties. It is considered that in the known processes, the presence of Ti results in a very hard Ti compound and, consequently, degrades the workability. On the other hand, in the embodiment, which uses the alloyed Cu—Sn compound powder as part of the raw material, the presence of Ti does not adversely affect the workability even if a small amount of hard Ti compound is produced. In order to prepare a raw material powder containing Ti, a Ti powder may be added together with the Sn powder (and a Cu powder, if necessary), or an alloyed Ti powder (for example, Cu—Sn—Ti, Sn—Ti, or Cu—Ti powder) may be added to the Cu—Sn powder, the Sn powder, or the Cu powder.

The compacted raw material powder is packed into a sheath made of Nb or Nb alloy, followed by diameter reduction. In the diameter reduction, the diameter of the sheath is reduced to about 50 μm or less, and consequently, the diameter of the powder core is reduced to about 40 μm or less. If the Cu—Sn compound powder contains coarse particles having larger diameters than the diameter of the powder core, the grain size of such particles is difficult to reduce by wiredrawing and the sheath can be damaged by the coarse particles. Specifically, the presence of coarse particles of Cu—Sn compound powder with grain sizes larger than the diameter of the powder core can cause the sheath to be locally deformed or hinder uniform wiredrawing. In the worst case, the coarse particles may burst through the wall of the sheath and break the material in the course of the process. Even if the process is completed, Sn is dispersed into the Cu matrix (stabilizing copper) to increase the resistance (to reduce residual resistivity ratio) of the Cu during the heat treatment for forming $Nb_3Sn$. In order to eliminate such a disadvantage, the maximum grain size of the Cu—Sn compound powder in the raw material powder is preferably about 15 μm or less.

The sheath used in the embodiment is made of Nb or a Nb alloy. Preferably, a Nb alloy containing a metal element, such as Ta, Ti, V, Hf, Zr, or Mo, is used from the viewpoint of increasing the properties in high magnetic field regions.

The Sn content in the Cu—Sn compound powder is preferably in the range of about 20 to 80 mass %. If the Sn content is less than 20 mass %, the production of $Nb_3Sn$ is reduced. If the Sn content is more than 80 mass %, the melting point of the Cu—Sn compound powder is reduced and consequently the Cu—Sn compound may be melted by annealing in the course of the manufacture.

Preferably, the Sn powder is added to the Cu—Sn compound powder at a mass ratio in the range of about 0.2 to 2 relative to the Cu—Sn compound powder (more specifically, the ratio of the Sn powder to the Cu—Sn compound powder is about 0.2:1 to 2:1). If the Sn ratio is less than 0.2, Sn cannot be sufficiently distributed among the particles of the Cu—Sn compound powder and, consequently, the workability is degraded. If the Sn ratio is more than 2, Sn may melt out by heat in the process because of the excessive amount of Sn. If the raw material powder contains a Cu powder or a Ti powder, these powders can be substituted for part of the Sn powder in the raw material powder. The amount of the substitution is preferably limited to 30 atomic percent or less relative to the entirety of the raw material powder.

Preferably, the Sn powder added to the raw material powder contains 2,000 ppm or less of oxygen. If the oxygen content in the Sn powder is more than 2,000 ppm, an excessive amount of oxide coating is formed over the surfaces of the Sn powder particles and inhibits the dispersion of the Sn to suppress the reaction producing $Nb_3Sn$. The use of a Sn powder from which oxygen is reduced can enhance the reactivity in the $Nb_3Sn$ production. In order to prepare such a Sn powder, an atomization process performed in an atmosphere of an inert gas, such as $N_2$, is preferably applied.

Figure 2:
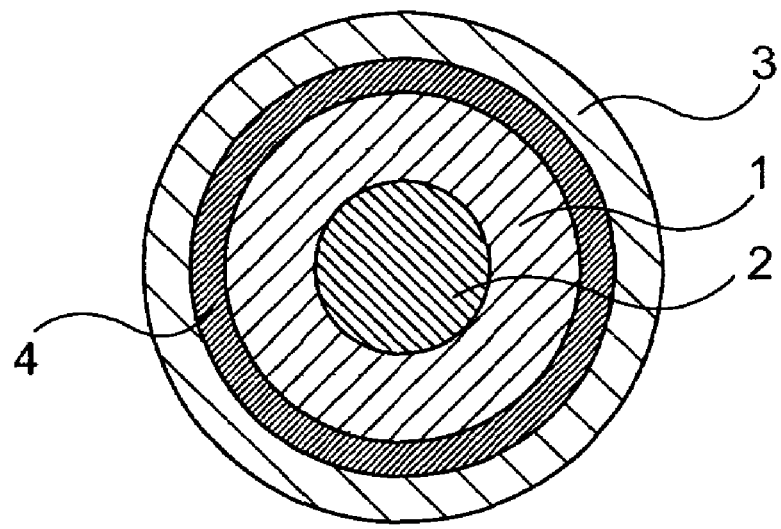
FIG. 2 is a schematic sectional view of a composite structure used in an embodiment of the present invention.

Preferably, the sheath is surrounded by an intermediate barrier layer. FIG. 2 is a schematic sectional view of a composite structure used in the present embodiment. This structure is basically similar to the structure shown in FIG. 1 and the same parts are designated by the same numerals. In the structure shown in FIG. 2, the sheath 1 is surrounded by an intermediate barrier layer 4. The intermediate barrier layer 4 is made of a material not reacting with Sn. For example, the intermediate barrier layer 4 is preferably made of Ta. Another material, such as Nb, V, Zr, Mo, Hf, or Ti, may be combined with Ta in such a manner as not to come into contact with Sn. For example, the intermediate barrier layer 4 may be made of a (two- or three-layer) composite including a layer of those elemental metals or their alloys and a Ta layer, or an alloy containing Ta not reacting with Sn. In other words, the intermediate barrier layer 4 contains at least one element selected from the above-listed elements.

The intermediate barrier layer 4 can prevent, for example, coarse particles of the compound powder from bursting through the wall of the sheath. In addition, even if the raw material powder is completely turned into $Nb_3Sn$, the intermediate barrier layer 4 prevents the Sn from reaching the stabilizing copper and thus prevents the contamination of the Cu matrix with Sn. Thus, a high residual resistivity ratio (RRR) can be achieved. Furthermore, the intermediate barrier layer 4 has a higher mechanical strength than the Nb or Nb alloy sheath 1. Accordingly, the workability in wiredrawing is enhanced so that the uniform processing can easily be achieved and the strength of the wire after reaction can be increased. The intermediate barrier layer 4 does not react with the constituent Sn in the raw material powder and allows the Sn to disperse into the intermediate barrier layer and then reach the sheath. The $Nb_3Sn$ phase can thus be formed at the internal surface of the sheath.

Preferably, the powder core (the raw material powder packed in the sheath) 2 has a two-layer structure whose outer layer is formed of part of the Sn powder. This structure can prevent, for example, coarse particles of the compound powder from bursting through the wall of the sheath, as in the case where the intermediate barrier layer 4 is provided. The combined use of the intermediate barrier layer 4 and the powder core having the two-layer structure further enhances the stability.

The two-layer structure of the powder core brings the Sn of the powder core into direct contact with the Nb in the sheath. Since Cu is not present in this instance, $Nb_3Sn$ is not produced by annealing at about 400 to 600° C. Thus, the consumption of the Sn can be reduced. In use of the two-layer structure, it is effective to disperse Cu from the inner layer of the powder core to the Sn outer layer by heating at about 200 to 550° C. before the heat treatment for $Nb_3Sn$ production. For the preparation of the two-layer structure, the proportion between the Cu—Sn powder and the Sn powder can be set in the above range.

The present invention will further be described with reference to examples. However, it will be readily appreciated by those skilled in the art that various modifications in form and detail may be made without departing from the scope and sprit of the invention.

EXAMPLE 1

A Sn powder (90 mass % or more of the particles had a grain size of 30 μm or less) was added to a Cu-33 mass % Sn compound powder (maximum grain size: 13.5 μm) at a mass ratio of 35% relative to the Cu—Sn powder. The powders were mixed in a V-blender for about 30 minutes. The resulting powder mixture was placed in a rubber mold and subsequently pressed into a compact with an outer diameter of 35 mm by CIP, holding under a pressure of 150 MPa for 5 minutes. According to ICP analysis, the Sn in the compact contained 540 ppm of oxygen.

The compact after the CIP analysis was clean, and no powder came off the compact. Also, no cracks occurred in the compact. The compact was mechanically processed into a cylinder of 31 mm in diameter.

The compact was inserted into a Nb-7.5 mass % Ta alloy sheath with an outer diameter of 57 mm and an inner diameter of 31 mm, and then the sheath was inserted into an extrusion billet made of oxygen-free copper with an outer diameter of 69 mm and an inner diameter of 57 mm. The ends of the billet were sealed by welding. The extrusion billet was extruded at room temperature using a hydrostatic extruder, and then formed into a hexagonal bar with an opposite side distance of 2 mm using a wiredrawing dies.

Fifty five hexagonal bars were bundled together and placed in a copper billet (stabilizing copper) with an outer diameter of 20 mm and an inner diameter of 17 mm. The billet was drawn again until the diameter was reduced to 1.2 mm. The material was uniformly wiredrawn without breakage. After wiredrawing, the cross section of the resulting wire was observed through an optical microscope. There was no breakage in the sheath or other problems.

The wire was heat-treated at 650° C. for 250 hours in a vacuum to produce $Nb_3Sn$. After the heat treatment, the critical current (Ic) of the resulting wire was measured while an external magnetic field was applied to the wire from a superconducting magnet. The critical current density (Jc) was calculated by dividing the Ic by the non-copper area of the cross section of the wire. The critical current density (Jc) was 785 $A/mm^2$ at 4.2 K in a magnetic field of 18 T.

EXAMPLE 2

A compact prepared in the same manner as in Example 1 was inserted into a Nb-7.5 mass % Ta alloy sheath with an outer diameter of 50 mm and an inner diameter of 31 mm, and a 0.2 mm thick Ta was wound around the sheath to a thickness of about 3 mm, thus forming an intermediate barrier layer.

The material was inserted into an extrusion billet made of oxygen-free copper with an outer diameter of 69 mm and an inner diameter of 56 mm. The ends of the billet were sealed by welding. The extrusion billet was extruded at room temperature using a hydrostatic extruder, and then formed into a hexagonal bar with an opposite side distance of 2 mm using a wiredrawing dies.

Fifty five hexagonal bars were bundled together and placed in a copper billet (stabilizing copper) with an outer diameter of 20 mm and an inner diameter of 17 mm. The billet was drawn again until the diameter was reduced to 1.2 mm. The material was uniformly wiredrawn without breakage. After wiredrawing, the cross section of the resulting wire was observed through an optical microscope. There was no breakage in the sheath or other problems.

The wire was heat-treated at 650° C. for 250 hours in a vacuum to produce $Nb_3Sn$. After the heat treatment, the critical current density (Jc) of the wire was measured in the same manner as in Example 1 and the result was 773 $A/mm^2$.

EXAMPLE 3

A powder mixture prepared in the same manner as in Example 1 was placed in a rubber mold and subsequently pressed into a compact (hereinafter referred to as powder mixture compact) with an outer diameter of 25 mm by CIP, holding under a pressure of 150 MPa for 5 minutes. The powder mixture compact was mechanically processed into a cylinder of 20 mm in diameter. At the same time, a Sn powder (90 mass % or more of the particles had a grain size of 30 μm or less) was formed into a cylindrical tube (hereinafter referred to as Sn compact) with an outer diameter of 33 mm and an inner diameter of 20 mm by CIP (150 MPa pressure for 5 minutes).

The powder mixture compact was inserted into the Sn compact to form a composite core (two-layer core). The composite core was inserted into a Nb-7.5 mass % Ta alloy sheath with an outer diameter of 57 mm and an inner diameter of 31 mm, and then the sheath was vacuum-encapsulated in an extrusion billet made of oxygen-free copper with an outer diameter of 69 mm and an inner diameter of 57 mm. The extrusion billet was extruded at room temperature using a hydrostatic extruder, and then formed into a hexagonal bar with an opposite side distance of 2 mm using a wiredrawing dies.

Fifty five hexagonal bars were bundled together and placed in the copper billet (stabilizing copper) with an outer diameter of 20 mm and an inner diameter of 17 mm. The billet was drawn again until the diameter was reduced to 1.2 mm. The material was uniformly wiredrawn without breakage. After wiredrawing, the cross section of the resulting wire was observed through an optical microscope. There was no breakage in the sheath or other problems.

The wire was heat-treated at 300° C. for 100 hours and 650° C. for 250 hours in a vacuum to produce $Nb_3Sn$. In this heat treatment step, pre-heat treatment at a lower temperature of 300° C. was performed to make the Sn and the Cu in the core uniform before the heat treatment for producing $Nb_3Sn$. This pre-heat treatment temperature is not limited to 300° C., and the pre-heat treatment may be performed in several steps.

After the heat treatment, the critical current density (Jc) of the wire was measured in the same manner as in Example 1 and the result was 762 $A/mm^2$.

COMPARATIVE EXAMPLE

A Cu-33 mass % Sn compound powder having a maximum grain size of 25 μm was packed into a Nb-7.5 mass % Ta alloy sheath with an outer diameter of 57 mm and an inner diameter of 31 mm while being pressed under a uniaxial pressure of about 10 MPa. The sheath was inserted into an extrusion billet made of oxygen-free copper with an outer diameter of 69 mm and an inner diameter of 57 mm. The ends of the billet were sealed by welding. The extrusion billet was extruded at room temperature using a hydrostatic extruder, and then formed into a hexagonal bar with an opposite side distance of 2 mm using a wiredrawing dies.

Fifty five hexagonal bars were bundled together and placed in a copper billet (stabilizing copper) with an outer diameter of 20 mm and an inner diameter of 17 mm. The billet was drawn again until the diameter was reduced to 1.2 mm. During the wiredrawing, the wire was broken 8 times. After the wiredrawing, the cross section of the resulting wire was observed through an optical microscope, and breakages were observed in 23 sheaths among the 55 filaments.

The wire was heat-treated at 650° C. for 250 hours in an vacuum to produce $Nb_3Sn$. After the heat treatment, the critical current density (Jc) of the wire was measured in the same manner as in Example 1, and the result was 153 A/mm$^2$.

What is claimed is:

1. A method for manufacturing a powder-metallurgy processed $Nb_3Sn$ superconducting wire, the method comprising the steps of:
    filling a sheath made of Nb or a Nb alloy with a raw material powder containing Sn;
    reducing a diameter of the sheath filled with the raw material powder to form a wire; and
    heat-treating the wire to form a superconducting phase at an internal surface of the sheath,
    wherein the raw material powder contains a Cu—Sn alloy powder or a Cu—Sn intermetallic compound powder and a Sn powder, and is compacted under isotropic pressure before the step of filling the sheath, and
    wherein the Sn content in the Cu—Sn alloy powder or the Cu—Sn intermetallic compound powder is in a range of about 20 to 80 mass %, and the Sn powder is contained in the raw material powder at a mass ratio of about 0.2 to 2.0 relative to the Cu—Sn alloy powder or the Cu—Sn intermetallic compound powder.

2. The method according to claim 1, wherein the Cu—Sn alloy powder or the Cu—Sn intermetallic compound powder has a maximum grain size of about 15 μm or less.

3. The method according to claim 1, wherein the Sn powder contains 2,000 ppm or less of oxygen.

4. The method according to claim 3, wherein the Sn powder is prepared by inert gas atomization.

5. The method according to claim 1, wherein the sheath is surrounded by an intermediate barrier layer containing at least one metal element selected from the group consisting of Ta, Nb, V, Zr, Mo, Hf, and Ti.

6. A method for manufacturing a powder-metallurgy processed $Nb_3Sn$ superconducting wire, the method comprising the steps of:
    filling a sheath made of Nb or a Nb alloy with a raw material powder containing Sn;
    reducing a diameter of the sheath filled with the raw material powder to form a wire; and
    heat-treating the wire to form a superconducting phase at an internal surface of the sheath,
    wherein the raw material powder contains a Cu—Sn alloy powder or a Cu—Sn intermetallic compound powder and a Sn powder, and is compacted under isotropic pressure before the step of filling the sheath, and
    wherein the raw material powder filling the sheath has a two-layer structure including an inner layer and an outer layer and the outer layer is formed of part of the Sn powder.

7. The method according to claim 6, wherein the Cu—Sn alloy powder or the Cu—Sn intermetallic compound powder has a maximum grain size of about 15 μm or less.

8. The method according to claim 6, wherein the Sn powder contains 2,000 ppm or less of oxygen.

9. The method according to claim 8, wherein the Sn powder is prepared by inert gas atomization.

10. The method according to claim 6, wherein the sheath is surrounded by an intermediate barrier layer containing at least one metal element selected from the group consisting of Ta, Nb, V, Zr, Mo, Hf, and Ti.

11. A precursor to a powder-metallurgy processed $Nb_3Sn$ superconducting wire, comprising:
    a sheath made of Nb or a Nb alloy; and
    a raw material powder filling the sheath, containing a Cu—Sn alloy powder or a Cu—Sn intermetallic compound powder and a Sn powder,
    wherein the precursor is used in a process for manufacturing a powder-metallurgy processed $Nb_3Sn$ superconducting wire, including the steps of reducing the diameter of the precursor to form a wire, and heat-treating the wire to form a superconducting phase at the interface between the sheath and the raw material powder, and
    wherein the Sn content in the Cu—Sn alloy powder or the Cu—Sn intermetallic compound powder is in the range of about 20 to 80 mass %, and the raw material powder contains the Sn powder in a mass ratio of about 0.2 to 2.0 relative to the Cu—Sn alloy powder or the Cu—Sn intermetallic compound powder.

12. The precursor according to claim 11, wherein the Cu—Sn alloy powder or the Cu—Sn intermetallic compound powder has a maximum grain size of about 15 μm or less.

13. The precursor according to claim 11, wherein the raw material powder has been compacted under isotropic pressure.

* * * * *